United States Patent [19]
Smith et al.

[11] Patent Number: 5,986,887
[45] Date of Patent: Nov. 16, 1999

[54] STACKED CIRCUIT BOARD ASSEMBLY ADAPTED FOR HEAT DISSIPATION

[75] Inventors: Grant M. Smith, Bryn Athyn; Vladimir K. Tamarkin, Huntingdon Valley, both of Pa.

[73] Assignee: Unisys Corporation, Blue Bell, Pa.

[21] Appl. No.: 09/181,448

[22] Filed: Oct. 28, 1998

[51] Int. Cl.⁶ ..................................................... H05K 7/20
[52] U.S. Cl. ........................ 361/704; 361/690; 361/707; 361/709; 361/713; 361/719; 361/721; 165/80.2; 165/80.3; 165/185; 174/16.3; 174/16.1
[58] Field of Search .................................. 361/690, 694, 361/695, 704, 707, 715–721; 174/16.1, 16.3; 165/80.2, 80.3, 185

[56] References Cited

U.S. PATENT DOCUMENTS

| | | | |
|---|---|---|---|
| 4,081,825 | 3/1978 | Koopman et al. | 357/81 |
| 4,628,407 | 12/1986 | August et al. | 361/388 |
| 4,887,353 | 12/1989 | Preputnick | 361/721 |
| 4,963,976 | 10/1990 | Fluegel et al. | 357/82 |
| 5,014,904 | 5/1991 | Morton | 228/176 |
| 5,020,586 | 6/1991 | Mansingh | 165/80.3 |
| 5,181,167 | 1/1993 | Davidson et al. | 361/699 |
| 5,353,192 | 10/1994 | Nordin | 361/700 |
| 5,390,078 | 2/1995 | Taylor | 361/721 |
| 5,424,919 | 6/1995 | Hielbronner | 361/710 |
| 5,548,161 | 8/1996 | Hirano et al. | 257/722 |
| 5,699,234 | 12/1997 | Saia et al. | 361/790 |
| 5,701,233 | 12/1997 | Carson et al. | 361/735 |
| 5,812,374 | 9/1998 | Shuff | 361/704 |

*Primary Examiner*—Leo P. Picard
*Assistant Examiner*—Boris L. Chervinsky
*Attorney, Agent, or Firm*—Steven B. Samuels; Mark T. Starr; Ratner & Prestia

[57] ABSTRACT

An apparatus is provided for dissipating heat from a stacked circuit board assembly. The apparatus includes circuit boards that are oriented in spaced planes that extend substantially parallel to one another. A heat transfer means connected to the circuit boards transfers heat between the circuit boards. A heat dissipation means connected to at least one of the circuit boards dissipates at least a portion of the transferred heat.

26 Claims, 5 Drawing Sheets

STACKED CIRCUIT BOARD ASSEMBLY ADAPTED FOR HEAT DISSIPATION

FIELD OF THE INVENTION

The present invention relates generally to a circuit board assembly and, more particularly, to a stacked circuit board assembly having improved heat dissipation.

BACKGROUND OF THE INVENTION

In the field of computing, there has been an ever-increasing need for greater and more rapid data processing. To satisfy these needs, there have been many significant advances with respect to the design of faster and more complex processors, application specific integrated circuits (ASICs), and the like. Such complex circuits sometimes take advantage of the use of multiple parallel processors and ancillary circuitry.

Increased processing speeds are often accompanied with the need to increase the speed of communication across signaling paths between a processor and other processors or other ancillary circuitry. At higher communication speeds, however, transmission line effects of the signaling paths become more significant. These transmission line effects, such as signaling delay, may be reduced by shortening the length of the signaling paths.

Furthermore, as the clock frequency of electronics increases, the physical distance between components on a data path becomes more and more critical. This physical distance is particularly important between an integrated circuit such as an ASIC and a memory module such as a cache that is connected to the integrated circuit. The physical distance between such components will impact the access time and, therefore, the performance of the resulting circuit assembly.

One method of reducing the physical distance between circuit components is to stack the circuit board onto which they are assembled. For example, the signaling path between a first component on a first circuit board and a second component on a second circuit board may be reduced by stacking the first and second circuit boards. In addition to shortening signaling paths, stacking of circuit boards permits manufacturers to partition circuit modules on individual circuit boards; to manufacture smaller, less expensive circuit modules; to improve configurability and upgradability; and to achieve other benefits of such construction.

When circuit boards are stacked, however, air flow may be restricted such that it becomes difficult to adequately cool the circuit components on the circuit boards. If cooling capability is not improved, higher operating temperatures may result in premature failure of circuit components. A possible alternative, redirecting air flow, may be impossible due to other design constraints or may be too costly.

Attempts have been made to improve heat dissipation from a circuit board. For example, U.S. Pat. No. 5,014,904 to Morton describes a method and apparatus for dissipating heat from printed circuit boards and electronic devices mounted thereon. The printed circuit boards are provided with apertures for receiving thermal conductor pads. One end of each thermal conductor pad is secured to the bottom of an electronic device which is mounted on one side of a printed circuit board. The opposite end of the thermal conductor pad contacts a cold plate which is mounted on the opposite side of the printed circuit board.

U.S. Pat. No. 4,628,407 to August et al. describes a circuit module including electronic devices mounted on a circuit board. The circuit board includes conductive pads and plated-through holes forming a conductive flow path from each electronic device to the opposite side of the circuit board. The heat pads and plated-through holes can be connected with the circuit board's ground layer for better heat distribution.

Nevertheless, there is a need to improve the cooling of circuit boards that are stacked with respect to one another. Accordingly, it is an object of this invention to provide an improved stacked circuit board assembly that is adapted for improved heat dissipation.

SUMMARY OF THE INVENTION

This invention achieves the aforementioned objectives by providing a circuit board assembly that is uniquely adapted for the dissipation of heat. The assembly includes circuit boards that are oriented in spaced planes that extend substantially parallel to one another such that the circuit boards define a space between them. The circuit boards are connected to one another, and a heat transfer means such as a conductor connected to the circuit boards transfers heat between them. A heat dissipation means such as a heat sink connected to at least one of the circuit boards dissipates at least a portion of the transferred heat.

According to one aspect of the invention, the assembly preferably includes a connector connected to one of the circuit boards and a matching connector connected to the other circuit board. The preferred connectors are adapted to mate with each other for bridging the space between the circuit boards and for connecting the circuit boards to one another for the communication of electrical signals. The connectors can be elongated along an axis substantially parallel to the circuit boards, blocking an existing air flow path, without frustrating heat dissipation according to this invention.

DETAILED DESCRIPTION OF THE INVENTION

Figure 1:
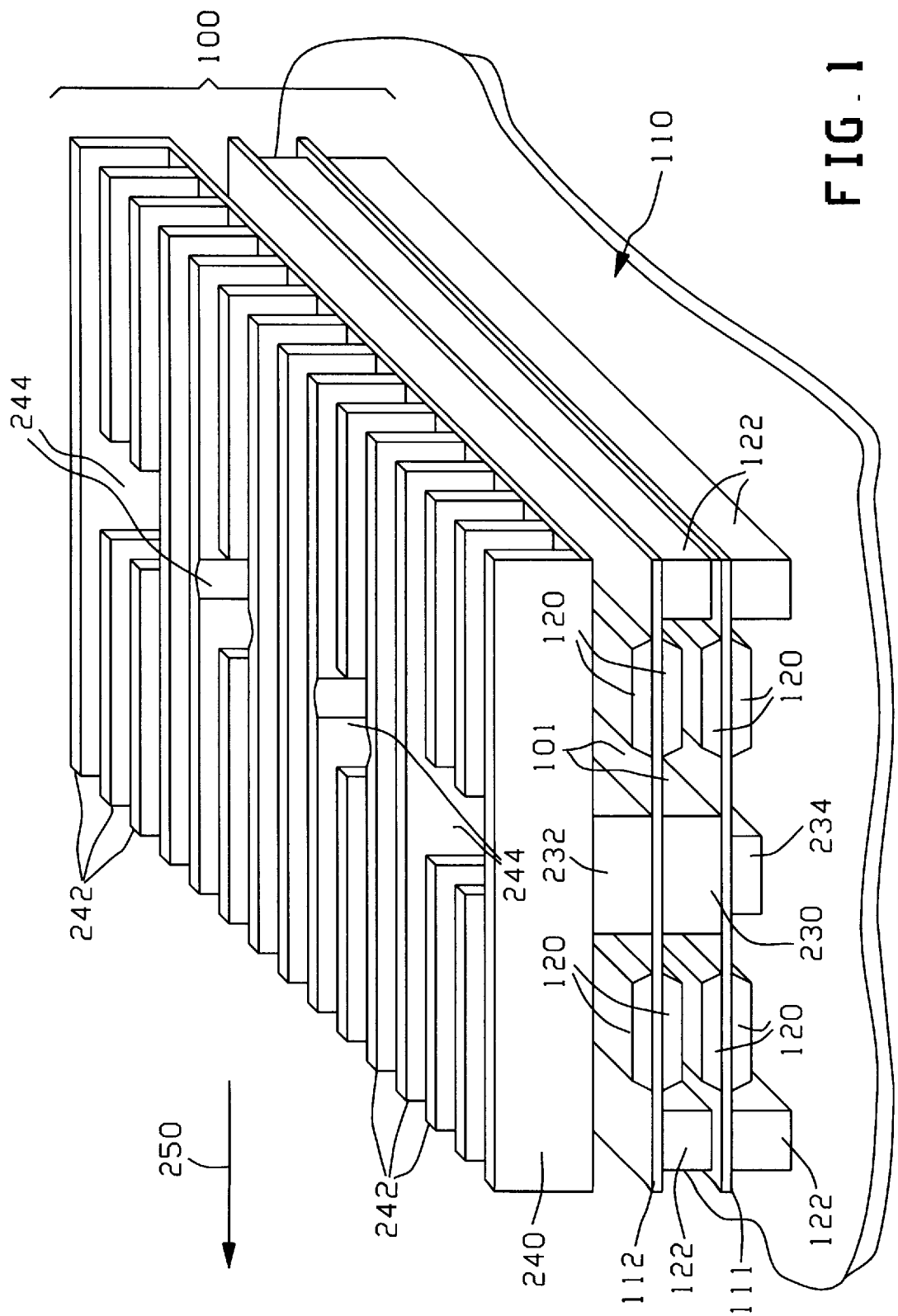
FIG. 1 is a perspective view of a circuit board assembly according to an exemplary embodiment of this invention.

Preferred aspects of this invention will now be described with reference to specific embodiments selected for illustration in the drawings. It will be understood that this invention is not limited in its spirit or scope to the embodiments selected for illustration and description herein. Instead, the invention is defined separately in the appended claims. Also, it will be appreciated that the various figures are not intended to be to proportion or to scale.

With reference to FIG. 1, a circuit board assembly 100 according to an exemplary embodiment of the invention is described. The circuit board assembly 100 is includes a first circuit board 110, a second circuit board 111, and a third circuit board 112. First circuit board 110 can be a main circuit board, a motherboard, or a parent board. Circuit boards 111 and 112 can be mezzanine or child boards that are mechanically and electrically connected to circuit board 110 and to one another. Each circuit board 110, 111 and 112 has respective circuit components such as components 120 mounted thereon. The exemplary circuit boards 110, 111, and 112 in FIG. 1 are in a stacked arrangement in order to reduce the physical distance between components on the stacked boards. The stacking of circuit boards is described by Tamarkin et al. in application Ser. No. __, filed Aug. 31, 1998, entitled "STACKABLE HIGH DENSITY RAM MODULES," which application is incorporated herein by reference.

Signals on the first circuit board 110 may be coupled to signals on circuit boards 111 and 112 using connectors 122. The connectors 122 are used for both mechanical attachment of one board to another and for electrical coupling of one board to another. More specifically, a pair of connectors 122 provides mechanical and electrical connection between circuit boards 110 and 111. Another pair of connectors 122 provides mechanical and electrical connection between circuit boards 111 and 112.

Figure 3:
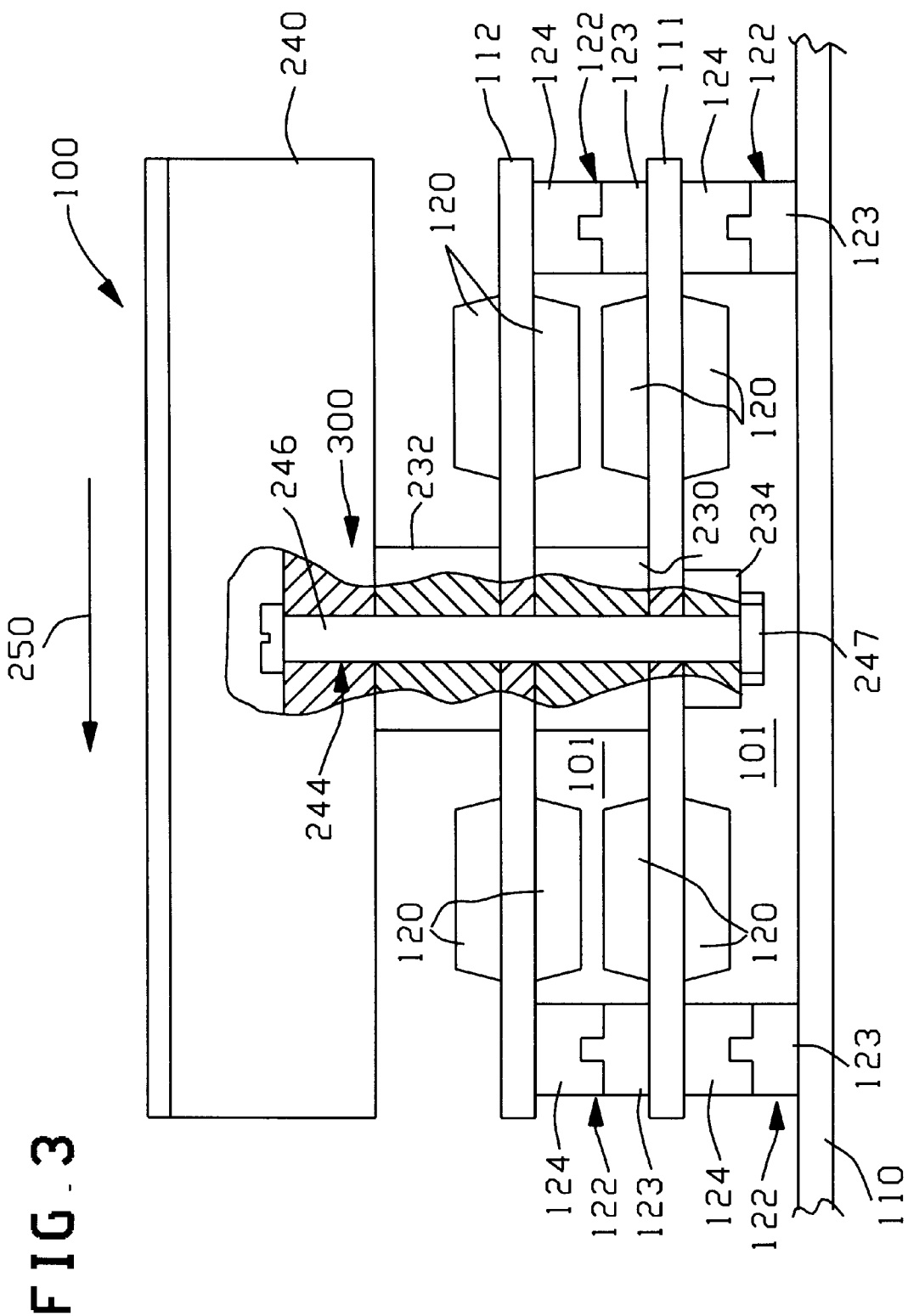
FIG. 3 is a side view of the circuit board assembly shown in FIG. 1, with a partial cross section illustrating an exemplary embodiment of this invention.

As shown in FIGS. 1 and 3, connectors 122 maintain circuit boards 110, 111, and 112 in substantially parallel arrangement with respect to one another, and spaces or gaps 101 are defined between the facing surfaces of adjacent circuit boards. Connectors 122, which in the embodiment illustrated in FIG. 1 are elongated along axes that are parallel to the circuit boards, bridge the spaces 101 between adjacent circuit boards.

Elongated connectors 122 provide for a large number of electrical contact connections between adjacent boards for the transmission of a large number of discrete and/or shared signals between the boards. It will be appreciated, however, that such connectors also block the flow of cooling air that is oriented in a direction at an angle or perpendicular to the axes of the connectors, as will be described in detail later.

A first conduction bar 230 transfers heat between the second circuit board 111, and the third circuit board 112. A second conduction bar 232 transfers heat between the second circuit board 111 and a heat sink 240. In an exemplary embodiment of the invention, the conduction bars 230, 232 are comprised of Aluminum and/or Copper or other suitably conductive materials. As shown in FIG. 1, conduction bars 230, 232 are rectangular in vertical cross-section and are elongated along the surfaces of the adjacent circuit boards.

The conduction bars 230, 232 shown in FIG. 1 are illustrated as continuous blocks across approximately the center of the surface of the stacked circuit boards 111 and 112. Alternatively, the teachings of this invention may be applied to other configurations of conduction bars such as multiple bars not extending completely across the circuit boards 111, 112 as well as conductors of any shape that can be located at various locations between the circuit boards 111, 112. The conduction bars may have fins for transferring heat to or from the environment surrounding the conduction bars.

The conduction bars 230, 232 shown in FIG. 1 are mounted adjacent to the surfaces of circuit boards 111, 112. Alternatively, the conduction bars may extend partially or completely into or through the circuit boards 111, 112. For example, a conduction bar may extend through a circuit board and couple to another conduction bar, or a single conduction bar may extend through all of the circuit boards.

When the direction of air flow is as illustrated by arrow 250 or at any angle to the axes of connectors 122, air flow across the circuit boards 110, 111 and 112 will be restricted by the elongated connectors 122, thereby reducing the flow rate of cooling air and the resulting heat dissipation. The conduction bars 230, 232 of the present invention allow the transfer of heat from the second circuit board 111 to the third circuit board 112, and from the third circuit board 112 to the heat sink 240, to dissipate the heat.

In an exemplary embodiment of the invention, the heat sink 240 is comprised of Aluminum and/or Copper or other conductive material. The heat sink 240 may take the form of other means for dissipating heat as known to those skilled in the art. For example, the heat sink 240 may also be a cold plate that is cooled by some other means such as by water cooling.

In an exemplary embodiment, the heat sink 240 includes fins 242 to improve the heat dissipation characteristics of the heat sink 240. Preferably the fins 242 are oriented parallel to the direction of air flow 250 for improved heat dissipation. In this embodiment, fins 242 are arranged in a direction that is substantially perpendicular to the axes of elongated connectors 122. The fins 242, together with the body of heat sink 240, define a series of channels through which air can flow for convection heat transfer from heat sink 240 to the air, thereby bringing about heat dissipation. Although parallel fins are shown in the exemplary embodiment, "pin fin" style heat sinks can be substituted as can any known heat sink configuration.

As a result of the heat transfer paths between circuit components 120, circuit boards 111 and 112, conduction bars 230, 232, and heat sink 240, heat generated by components 120 is transferred to heat sink 240 for dissipation by convection. Further details of the paths along which heat is transferred will be described in detail hereinafter.

Figure 4:
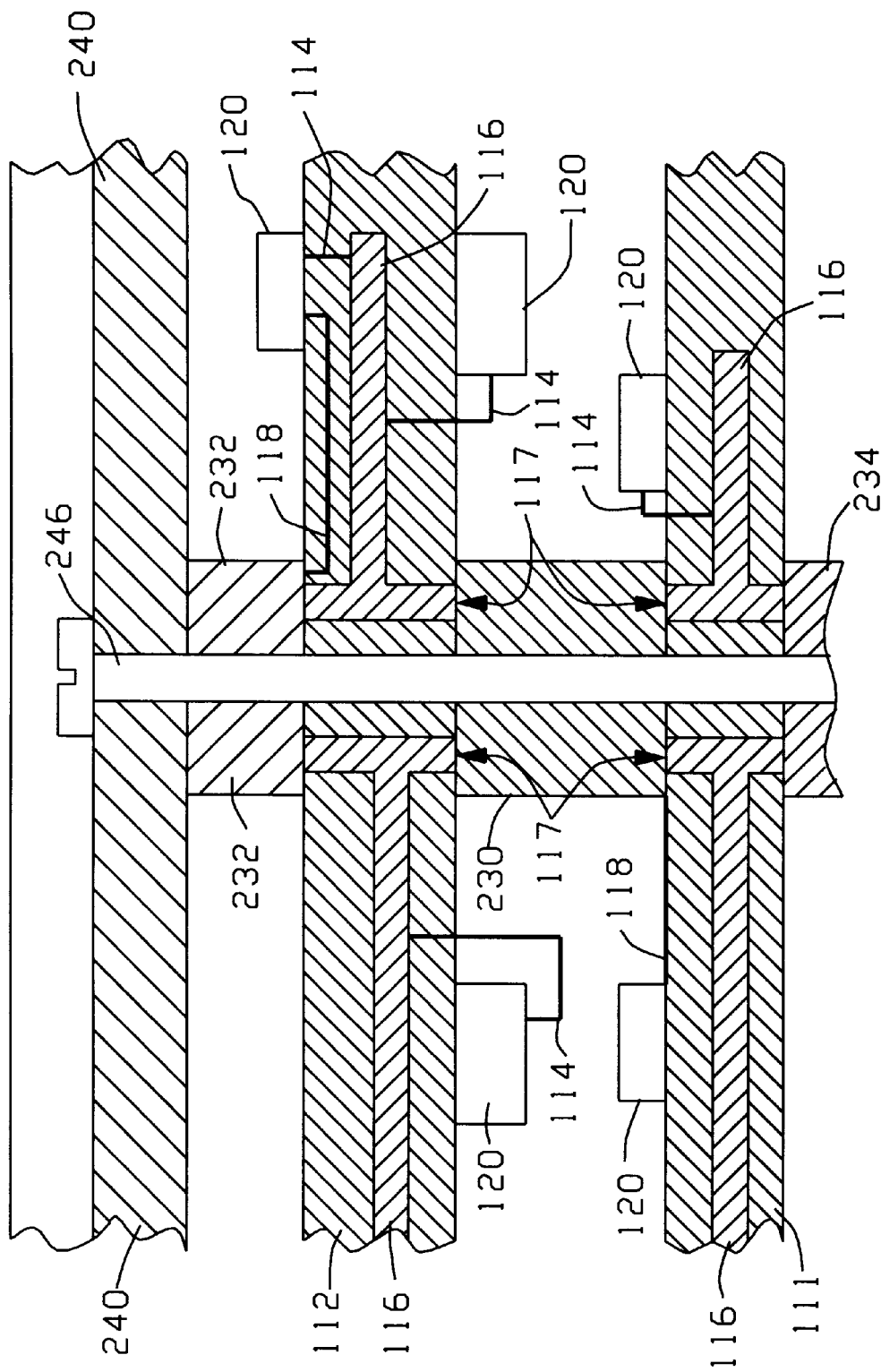
FIG. 4 is a cross-sectional side view of a portion of the circuit board assembly shown in FIG. 1, illustrating exemplary heat conduction paths according to aspects of this invention.

In the exemplary embodiment of the invention shown in FIG. 1, the components of the circuit board assembly 100 are mechanically fastened using bolts (FIGS. 3 and 4). Specifically, the heat sink 240 includes apertures 244 through which bolts may be inserted through the heat sink 240, the second conduction bar 232, the third circuit board 112, the first conduction bar 230, the second circuit board 111, and secured to a support bar 234. Further details will be described later with reference to FIG. 3.

Figure 2:
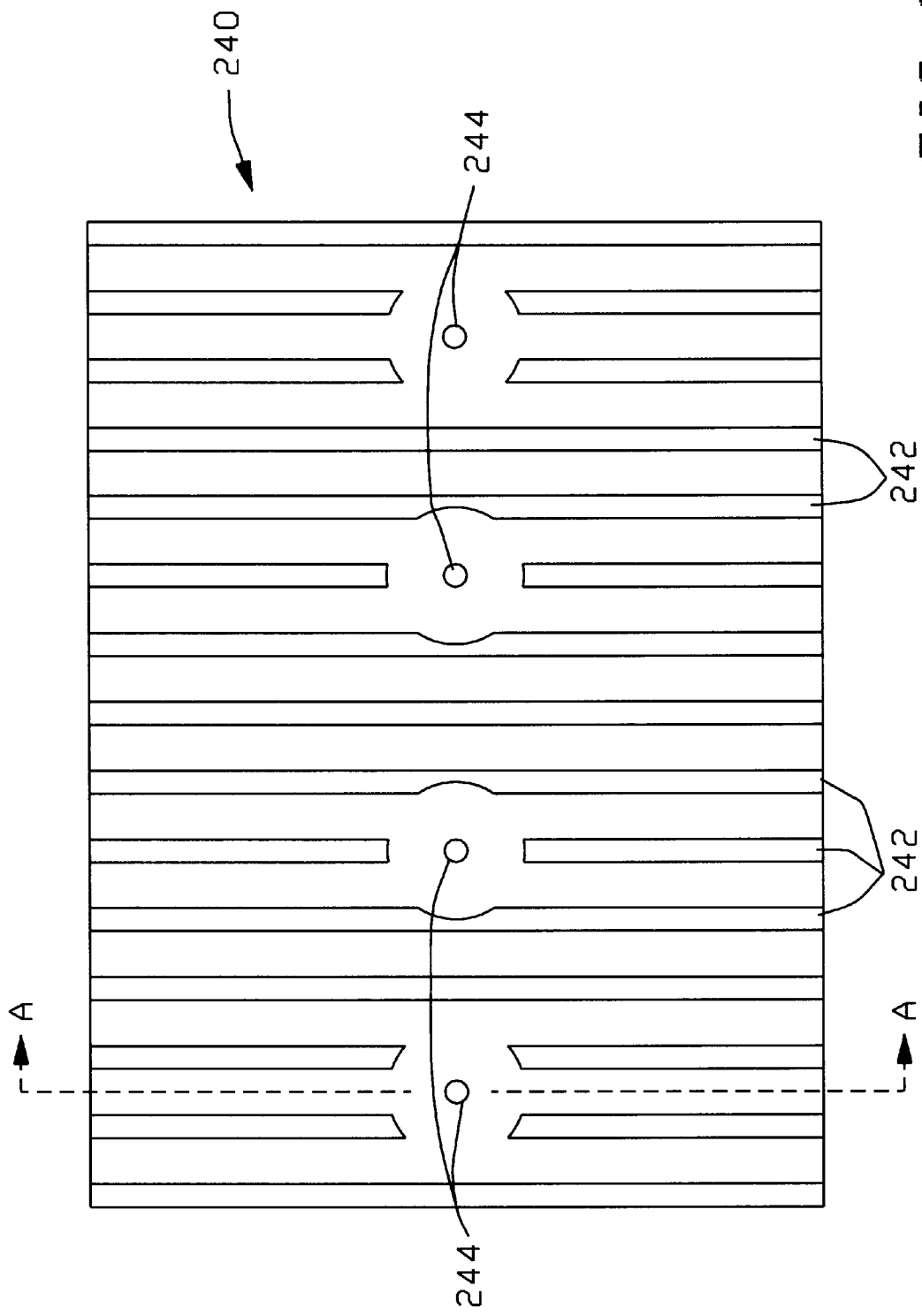
FIG. 2 is a top view of a heat sink adapted for use in a circuit board assembly according to an exemplary embodiment of this invention.

FIG. 2 shows a top view of the heat sink 240 illustrating exemplary positioning of the apertures 244 in the heat sink 240. The scope of this invention is not limited by the means used to secure the components of assembly 100 together. For example, bolts may extend through the support bar 234 and be secured by nuts (FIG. 4). Alternatively, conductive tapes and adhesives may be used, rather than bolts, to secure together the components of assembly 100.

FIG. 3 is a side view of a circuit board assembly 100 with a partial cross section illustrating an exemplary embodiment of the invention. Each connector 122 of FIG. 1 is shown in FIG. 3 as including a matching pair of a female connector 123 having contact sockets (not shown) and a male connector 124 having contact pins (not shown). The male connectors 124 mounted on the second circuit board 111 couple with the female connectors 123 mounted on the first circuit board 110. The male connectors 124 mounted on the third circuit board 112 couple to the female connectors 123 of second circuit board 111. Although not shown, male connectors 123 can be provided on the top surface of third circuit board 112 so that each board is the same and so that the board subassemblies are interchangeable to reduce manufacturing costs.

The partial cross-sectional view in FIG. 3 is taken along line A—A in FIG. 2. A bolt 246 extends through an aperture 244 in the heat sink 240, through the conduction bars 230, 232, through the circuit boards 111, 112, through support bar 234, and is secured by means of a nut 247.

FIG. 4 is a cross-sectional side view of a portion of the circuit board assembly 100, taken along line A—A in FIG. 2, illustrating preferred means of conducting heat from the circuit components 120 to the conduction bars 230, 232. Heat from a circuit component 120 may be conducted from the circuit component 120 through a first heat conductor 114 to a second heat conductor 116 provided on or in the circuit boards, which conducts heat to the conduction bars 230, 232. Alternatively, heat may be conducted from a circuit component 120 through a heat conductor 118 that is directly coupled to a conduction bar.

In an exemplary embodiment, a heat conductor, such as the illustrated second heat conductor 116, includes conductive vias 117 extending through the circuit board to a location on the circuit board's surface corresponding to at least one conduction bar 230, 232. The conductive vias 117 may directly contact the conduction bars 230, 232 or a thermal interface material (not shown) such as thermal tape may be used to improve the transfer of heat from the conductive vias 117 to the conduction bars 230, 232. The thermal conductivity of a printed circuit board in a direction normal to its surface is normally poor. Vias 117 provide the thermal path through the thickness of the boards.

In another exemplary embodiment, heat conductors comprise a layer or layers upon and/or within a circuit board. Referring to the second heat conductor 116 in FIG. 4, a heat conductor may be a layer within the circuit board 111, 112 that is coupled to a conductive via 117 for heat conduction to a conduction bar 230, 232.

In another exemplary embodiment, at least one of the heat conductors provides a signaling path in addition to a heat conduction path. For example, the second heat conductor 116 shown in FIG. 4 may also function as a ground plane within the circuit board. In addition to providing a path for heat dissipation, the second heat conductor 116 may then also couple the circuit components 120 to the ground plane of the circuit assembly 100. Thus, a heat conductor may provide the dual function of conducting heat and distributing power.

Figure 5:
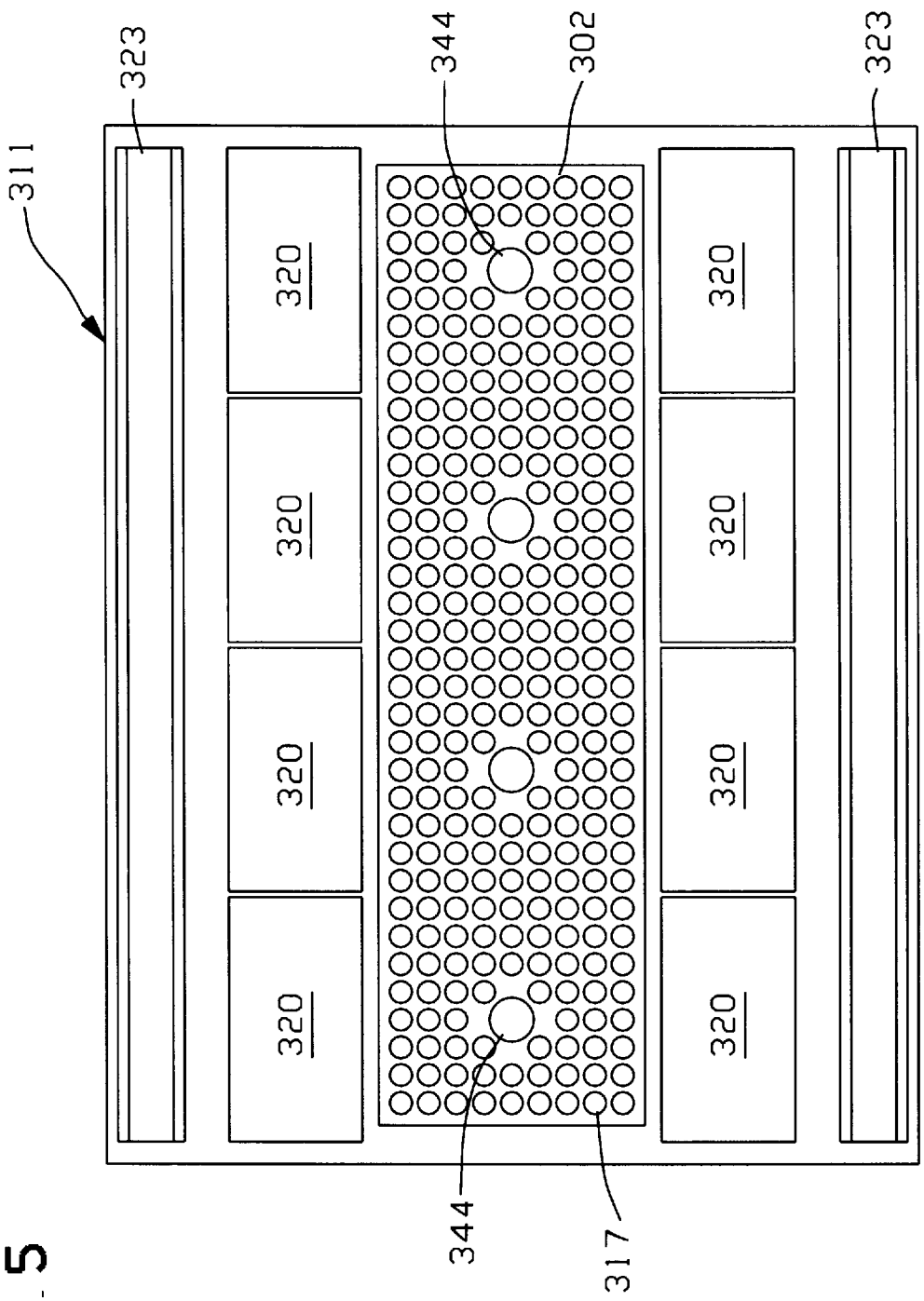
FIG. 5 is a top plan view of an embodiment of a circuit board that can be used in a circuit board assembly according to this invention.

Referring now to FIG. 5, an embodiment of a circuit board suitable for use in a circuit board assembly according to this invention is illustrated. A circuit board 311 is provided with connectors 323 that extend longitudinally along opposed edges of the board 311. Circuit components 320 such as RAM chips are mounted on the board's surface. Four apertures 344 are provided to facilitate assembly of the circuit board assembly by means of mechanical fasteners as described previously. A plated portion 302 provides a conductive surface on which one or more conduction bars (not shown) can be mounted. Conductive tape can be used between the conduction bar and plated portion 302. Apertures 344 can be plated through-holes to aid in conductive heat transfer. A plurality of plated through-holes 317 extend through the board 311 for connection to a plated portion on the opposite side (not shown) and for connection to components 320 for heat transfer therefrom. Plated through-holes 317 provide heat transfer paths across the thickness of circuit board 311.

Referring generally to FIGS. 1–4, it will be understood that in an assembly of stacked circuit boards, the path of cooling air flow may be partially or completely blocked by the circuit boards themselves or by the electrical and/or mechanical connections extending therebetween or by the components mounted thereon. Such interference with the cooling air flow reduces the dissipation of heat generated by electrical components mounted in the spaces between the stacked boards.

This invention improves heat dissipation from the components of a stacked circuit board assembly. In one embodiment, an assembly according to this invention transfers heat from electrical components on stacked circuit boards, transfers the heat between the stacked boards, and delivers the heat to a heat sink mounted adjacent to one of the circuit boards. Referring to FIGS. 1–4 for purposes of illustration, heat is transferred from electrical components 120 and through circuit boards 111, 112 by means of conductors 114, 116, 117 and/or 118. Heat from circuit board 111 is transferred by means of conduction bar 230 to circuit board 112. Heat from circuit boards 111 and 112 is in turn transferred by means of conduction bar 232 to heat sink 240. Air flow 250 (which is at least partially blocked from flowing through the spaces 101 between the spaced circuit boards by connectors 122) dissipates the transferred heat by convection.

The structure illustrated in FIGS. 1–4 has been discovered to be especially beneficial when stacked circuit boards are mounted within a chassis or enclosure that utilizes air movers such as box fans or impellers to bring about cooling air flow for heat dissipation. If the air movers are oriented to cause the cross-wise air flow 250, then a circuit board assembly according to this invention can facilitate the requisite heat dissipation, thereby avoiding elevated operating temperatures at the heat-generating components.

Although this invention has been described with reference to several embodiments and modifications thereof, it will be appreciated that many additional variations are contemplated and can be made without departing from the spirit or scope of this invention.

The circuit board assembly 100 shown in FIG. 1 illustrates circuit boards 110, 111 and 112 connected to each other using connectors 122 that extend between facing surfaces of adjacent boards. Alternatively, each parallel circuit board may use a connector (such as a board edge connector) to connect the parallel circuit board to another common circuit board (such as a perpendicularly mounted motherboard) in addition to or instead of interface connection extending directly between adjacent circuit boards. In other words, instead of using connectors 122 between circuit boards 111 and 112, circuit boards 110, 111 and 112 in FIG. 3 can be provided with edge connectors for mechanical and/or electrical connection to a main board that is oriented at an angle to circuit boards 110, 111 and 112. Also, the circuit board assembly 100 shown in FIG. 1 has circuit boards 110, 111, and 112 connected to one side of the heat sink 140. Multiple circuit boards may also be connected to the opposite side of the heat sink 140. Also, this invention applies to assemblies of only two boards as well as those utilizing three or more boards.

The circuit board assembly 100 according to the present invention eliminates the need for each circuit board to have a separate cooling path to a heat sink structure at its periphery. This allows for shorter heat conduction paths and reduces the usage of signal routing resources for heat dissipation purposes. Also, the use of dedicated heat sinks for each circuit board can be expensive and use valuable space.

Also, an assembly according to this invention makes it possible to dissipate heat by transferring it toward a central region of the circuit board as opposed to its edges. Transferring heat away from the periphery of a board allows heat conduction in a direction opposite to signal routing that may be directed toward peripherally located connectors. Also, using a common conduction bar to conduct heat away from multiple circuit components can reduce the usage of signal routing capacity as compared to using separate conductor components for each circuit component.

The means by which heat is transferred between the stacked circuit boards according to this invention can take various forms. Although longitudinally extending conduction bars 230, 232 are described herein for purposes of illustration, such conductors can be replaced with (or supplemented by) one or more conductors that extend along an axis that is not parallel to the stacked boards. For example, one or more conductors can extend along axes oriented perpendicular to the boards. Also, one-piece conductors can be provided to connect all of the stacked boards by extending through apertures in the boards. The conductors can have any shape, limited only by design constraints and cost considerations.

The components and materials of the assembly according to this invention as described herein can be substituted with equivalent components and materials. Also, separate components can be combined. For example, a conductor such as conduction is bar 232 can be combined, or made integral with, a heat sink such as heat sink 240. Likewise, a conductor such as conduction bar 230 can be divided into separate conductors that can be positioned at various locations and orientations between the stacked boards. The various vias and conduction paths provided on the stacked boards can be oriented in various positions to correspond to the conductors, and the vias and conduction paths can be provided in any size and quantity necessary to achieve adequate heat transfer between the heat-generating electrical components on a stacked board and the conductor or conductors that extend between the boards.

Heat transfer vias can be provided by means of plated through-holes (FIG. 5) as well as solid conductor paths. Also, as indicated in FIG. 5, the portion of each board that is mounted adjacent a conductor that extends between boards can be plated with a conductive layer that is in heat transfer communication with one or more vias.

Although this invention is beneficially used when connector components extending between stacked boards are oriented perpendicular (or at some angle) to the air flow direction, it can also be used to improve the heat dissipation of assemblies wherein the air flow is parallel to the orientation of the connector components. Also, although this invention has been described in connection with forced convection such as that caused by the use of one or more air movers, it can also be used to improve heat dissipation of assemblies wherein the only air flow is caused by the bouyancy of the heated air as it rises, thereby causing flow or circulation for natural convection.

While exemplary embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the scope of the invention.

What is claimed:

1. A circuit board assembly adapted for heat dissipation therefrom comprising:

circuit boards oriented in spaced planes extending substantially parallel to one another, said circuit boards together defining a space between, at least one of said circuit boards comprising a conductor positioned for conductive heat transfer therethrough;

heat transferring means bridging said space defined between adjacent circuit boards and contacting a surface of each of said adjacent circuit boards for transferring heat from one of said adjacent circuit boards to the other one of said adjacent circuit boards; and heat dissipating means connected to at least one of said circuit boards for dissipating from said circuit board at least a portion of said transferred heat.

2. The circuit board assembly of claim 1, further comprising means for electrically connecting said circuit boards to one another.

3. The circuit board assembly of claim 1, wherein said heat transferring means is formed from a metal selected from the group consisting of aluminum and copper.

4. The circuit board assembly of claim 1, wherein said heat transferring means comprises a heat sink having fins defining channels through which air flows.

5. A circuit board assembly adapted for heat dissipation therefrom comprising:

a circuit board;

a spaced circuit board located at a distance with respect to said circuit board and extending substantially parallel thereto, said circuit board and said spaced circuit board together defining a space therebetween, at least one of said circuit board and said spaced circuit board comprising a conductor positioned for conductive heat transfer therethrough;

a heat conductor contacting a surface of said circuit board and a surface of said spaced circuit board and extending across said space defined between said circuit board and said spaced circuit board, said heat conductor being in contact with said surfaces of said circuit board and said spaced circuit board for conductive heat transfer between said circuit board and said spaced circuit board; and a heat sink connected to said circuit board or to said spaced circuit board for at least partial dissipation of heat transferred by said heat conductor between said circuit board and said spaced circuit board.

6. The circuit board assembly defined in claim 5, further comprising:

a connector connected to said circuit board and to said spaced circuit board and extending across said space defined between said circuit board and said spaced circuit board, said connector being adapted to communicate electrical signals between said circuit board and said spaced circuit board.

7. The circuit board assembly defined in claim 6, wherein said connector is elongated along an axis substantially parallel to said circuit board and said spaced circuit board, thereby reducing air flow into said space from a direction at an angle to said axis.

8. The circuit board assembly defined in claim 7, wherein said heat sink comprises fins defining channels through which air flows for heat dissipation from said heat sink.

9. The circuit board assembly defined in claim 8, wherein said channels are oriented at an angle substantially parallel to said air flow.

10. The circuit board assembly defined in claim 5, further comprising a memory module mounted on said spaced circuit board, said spaced circuit board comprising means for transferring heat from said memory module to said heat conductor.

11. The circuit board assembly defined in claim 5, wherein said heat conductor is elongated along an axis substantially parallel to said spaced circuit board.

12. The circuit board assembly defined in claim 11, wherein said connector is elongated along an axis that is substantially parallel to said axis of said heat conductor.

13. The circuit board assembly defined in claim 5, wherein said heat conductor is formed from a metal selected from the group consisting of aluminum and copper.

14. The circuit board assembly defined in claim 5, wherein said heat conductor and said heat sink are mounted adjacent to opposite surfaces of said spaced circuit board.

15. A stacked circuit board assembly comprising:
   a main circuit board;
   a plurality of stacked circuit boards spaced with respect to said main circuit board and extending substantially parallel thereto, said stacked circuit boards together defining a space therebetween, at least one of said stacked circuit boards comprising a conductor positioned for conductive heat transfer therethrough for transferring heat from one surface to another surface of said at least one stacked circuit board;
   at least one memory module mounted on said at least one stacked circuit board and connected to said conductor of said at least one stacked circuit board;
   a heat conductor contacting a surface of each of said stacked circuit boards and extending across said space defined between said stacked circuit boards, said heat conductor being in contact with said surface of each of said stacked circuit boards for heat transfer between said stacked circuit boards, and said heat conductor being in contact with said conductor of said at least one stacked circuit board for heat transfer from said memory module; and
   a heat sink connected to a stacked circuit board for at least partial dissipation of heat transferred by said heat conductor from said memory module.

16. The assembly of claim 15, further comprising interface connectors for connection between said stacked circuit boards and said main circuit board.

17. The assembly of claim 15, wherein said heat transfer path comprises a via extending across the thickness of said stacked circuit boards for transferring heat from one surface to another surface of said stacked circuit boards.

18. The assembly of claim 16, wherein said via comprises a plated through-hole.

19. The apparatus of claim 15, wherein said heat sink comprises fins defining channels through which cooling air flows.

20. The assembly of claim 19, wherein said stacked circuit boards are connected by elongated interface connectors, and wherein said fins are of said heat sink are oriented to be substantially perpendicular to an axis of said elongated interface connectors.

21. A circuit board assembly adapted for heat dissipation therefrom comprising:
   circuit boards oriented in spaced planes extending substantially parallel to one another, said circuit boards together defining a space therebetween, at least one of said circuit boards comprising a conductor positioned for transmitting heat from one surface to another surface of said at least one circuit board;
   means contacting adjacent circuit boards for transferring heat from one of said adjacent circuit boards to the other one of said adjacent circuit boards; and
   means connected to at least one of said circuit boards for dissipating from said circuit board at least a portion of said transferred heat.

22. The circuit board assembly of claim 21, said conductor of said at least one circuit board comprising a via extending across the thickness of said at least one circuit board.

23. The circuit board assembly of claim 21, said means for transferring heat bridging said space defined between said adjacent circuit boards and contacting a surface of each of said adjacent circuit boards.

24. A circuit board assembly adapted for heat dissipation therefrom comprising:
   a circuit board;
   a spaced circuit board located at a distance with respect to said circuit board and extending substantially parallel thereto, said circuit board and said spaced circuit board together defining a space therebetween, at least one of said circuit board and said spaced circuit board comprising a conductor extending from one surface to another surface thereof;
   a heat conductor contacting said circuit board and said spaced circuit board and extending across said space defined between said circuit board and said spaced circuit board, said heat conductor being in contact with said circuit board and said spaced circuit board for conductive heat transfer from said circuit board to said spaced circuit board or from said spaced circuit board to said circuit board; and
   a heat sink connected to said circuit board or to said spaced circuit board for at least partial dissipation of heat transferred by said heat conductor between said circuit board and said spaced circuit board.

25. The circuit board assembly of claim 24, said conductor of said at least one of said circuit board and said spaced circuit board comprising a via extending across the thickness of at least one of said circuit board and said spaced circuit board.

26. The circuit board assembly of claim 24, said heat conductor bridging said space defined between said circuit board and said spaced circuit board and contacting a surface of said circuit board and a surface of said spaced circuit board.

* * * * *